(12) United States Patent
Khoury

(10) Patent No.: US 6,504,887 B1
(45) Date of Patent: Jan. 7, 2003

(54) APPARATUS AND METHOD FOR AN ERROR MINIMIZING PHASE LOCKED LOOP

(76) Inventor: Peter G. Khoury, 2766 22$^{nd}$ St., San Francisco, CA (US) 94110

( * ) Notice: Subject to any disclaimer, the term of this patent is extended or adjusted under 35 U.S.C. 154(b) by 0 days.

(21) Appl. No.: 09/375,923

(22) Filed: Aug. 17, 1999

(51) Int. Cl.$^7$ ................................................ H03D 3/24
(52) U.S. Cl. ........................ 375/376; 375/341; 714/794
(58) Field of Search ................................. 375/376, 375, 375/294, 327, 341, 262; 714/707, 731, 744, 794, 795, 796

(56) References Cited

U.S. PATENT DOCUMENTS

| | | | |
|---|---|---|---|
| 5,093,847 A | 3/1992 | Cheng ......................... | 375/97 |
| 5,107,522 A | * 4/1992 | Kitayama et al. ........... | 375/344 |
| 5,291,144 A | 3/1994 | Ichiyoshi .................... | 328/155 |
| 5,406,593 A | * 4/1995 | Chennakeshu et al. ..... | 375/376 |
| 5,754,598 A | 5/1998 | Barrett, Jr. et al. ......... | 375/327 |
| 5,875,215 A | 2/1999 | Dobrica ....................... | 375/344 |
| 5,991,914 A | * 11/1999 | Honma ........................ | 714/794 |

OTHER PUBLICATIONS

Fuminori Kobayashi et al.; "Efficient digital techniques for implementing a class of fast phase–locked loops (PLL'S);" IEEE Transactions on Industrial Electronics, vol. 43, No. 6, Dec. 1996.

* cited by examiner

*Primary Examiner*—Phuong Phu
(74) *Attorney, Agent, or Firm*—Lumen Intellectual Property Services, Inc.

(57) ABSTRACT

A method of estimating a period and a time delay, or phase, of an input signal. A plurality of transition times $\tilde{t}_i$ are received, each transition time $\tilde{t}_i$ having a weight $\alpha \tilde{\gamma}_i$ comprising a forgetting factor $\alpha$ and a weighting factor $\tilde{\gamma}_i$. Upon receiving an $N^{th}$ transition time to and determining an $N^{th}$ weighting factor $\gamma_0$, maximum likelihood estimates $\hat{T}$ and $\hat{t}_\phi$ of the period and the time delay, respectively, are calculated. The estimates are computed recursively, with $\hat{T}$ depending upon $\alpha$, $\gamma_0$, $t_0$, and a preceding maximum likelihood estimate $\hat{T}$ of the period. The value of $\hat{t}_\phi$ depends upon $\alpha$, $\gamma_0$, and $t_0$. The estimates $\hat{T}$ and $\hat{t}_\phi$ also depend on sums $S_{N-1}^{(n)} = \Sigma_{i=-(N-2)}^{0} i^n \alpha^{-i} \tilde{\gamma}_i$. After the estimates $\hat{T}$ and $\hat{t}_\phi$ are computed, the sums are updated in anticipation of the next transition time. The method is preferably implemented electronically, resulting in a digital phase locked loop. The weighting factors allow the digital phase locked loop to lock onto a signal having absent transitions.

20 Claims, 5 Drawing Sheets

APPARATUS AND METHOD FOR AN ERROR MINIMIZING PHASE LOCKED LOOP

FIELD OF THE INVENTION

This invention relates generally to methods of timing recovery, and in particular to a digital phase locked loop that uses a recursive, weighted least squares algorithm to determine maximum likelihood estimates of the period and phase of an incoming signal.

BACKGROUND

Phase locked loops are used to synchronize an electronic device to a regular electrical signal. One possible form that a source signal $s_{ideal}$ can take is sinusoidal, $$s_{ideal}(\omega,\phi,t)=\sin(\omega t+\phi).$$

If the source signal has an unknown frequency $\omega_s$, an unknown phase $\phi_s$, and is corrupted by noise $n(t)$, the phase locked loop receives an input signal $s(t)$, where $$s(t)=s_{ideal}(\omega_s,\phi_s,t)+n(t).$$

The phase locked loop estimates the values of the frequency and the phase of the received signal to be $\hat\omega$ and $\hat\phi$, respectively. Synchronization occurs when the difference between the estimates and the true values have decreased below given tolerances $\epsilon_\omega$ and $\epsilon_\phi$:

$$|\omega_s-\hat\omega|<\epsilon_\omega \text{ and } |\phi_s-\hat\phi|<\epsilon_\phi.$$

The phase locked loop uses the estimates $\hat\omega$ and $\hat\phi$ to generate an output signal. Phase locked loops typically achieve synchronization between the input and output signals using a feedback loop comprising a phase detector, a low pass filter, and a voltage controlled oscillator. While the feedback loop converges to the true values of the frequency and phase given infinite time, the rate of convergence is often slow.

A number of phase locked loops have been designed to have an improved convergence rate. In U.S. Pat. No. 5,754,598 by Barrett, Jr. et al., modern optimal control techniques are used to control a phase locked loop for a predetermined period. Classical control techniques are used after the predetermined period. In U.S. Pat. No. 5,291,144 by Ichiyoshi, the input and output signals are complex. The output signal is multiplied by the input signal to obtain a complex phase difference, which is used as feedback to control the output signal.

U.S. Pat. No. 5,093,847 by Cheng describes an adaptive phase locked loop that has coefficients that are automatically adjusted to minimize an error signal. A purely digital approach is presented in "Efficient Digital Techniques for Implementing a Class of Fast Phase-Locked Loops" by Kobayashi et al., IEEE Transactions on Industrial Electronics, 43 (1996) pp. 616–620. In this approach, several previous measurements of the frequency of the input signal are averaged to calculate the estimated frequency $\hat\omega$. However, none of the above phase locked loops are stable under large perturbations of the input signal. Furthermore, the digital approach mentioned above fails to take full advantage of modern computing power.

Finally, in U.S. Pat. No. 5,875,215 by Dobrica, a carrier synchronizing unit uses a recursive least square type phase and amplitude estimation. The synchronizing unit uses known symbol information to characterize the channel through which the input signal propagates prior to being received. However, the synchronizing unit does not lock onto the input signal directly, nor does it estimate the period of the input signal.

Furthermore, many current phase locked loops assume that the input signal is periodic. If the input signal is a digital bit stream, however, the signal is not periodic. The potential for a transition between bits occurs regularly, but a transition does not necessarily take place at every potential transition time. Present state-of-the-art systems that lock on to such aperiodic signals are not tolerant to high levels of interference and noise on the input signal.

OBJECTS AND ADVANTAGES

It is therefore a primary object of the present invention to provide a phase locked loop that converges quickly to an input signal, is robust to perturbations of the input signal, and estimates the period and phase of the input signal using purely digital means. It is an other object of the present invention to provide a phase locked loop that can lock onto a signal having periodic characteristics but which is not itself periodic.

The invention has the advantage that it provides an efficient and stable phase locked loop that can be implemented using modern integrated circuit technology. The invention has the additional advantage that it can lock onto certain noisy aperiodic signals.

SUMMARY

A method of estimating a period and a time delay of an input signal comprises the step of identifying a plurality of transition times $\tilde t_i$ of the input signal, where $i=-(N-2)$ to $0$. Each transition time $\tilde t_i$ has a corresponding weight $\alpha^{-i}\gamma_i$ comprising a forgetting factor $\alpha$ and a weighting factor $\gamma_i$. The forgetting factor $\alpha$ reduces the importance of transition times that occurred in the past. The weighting factor $\gamma_i$ gives the relative importance of transition time $\tilde t_i$.

Upon receiving an $N^{th}$ transition time $t_0$ and an $N^{th}$ weighting factor $\gamma_0$, the period and the time delay of the input signal are estimated as $\hat T$ and $\hat t_\phi$, respectively. The time delay is proportional to the phase of the input signal. The values of $\hat T$ and $\hat t_\phi$ are computed by maximum likelihood techniques using a least squares minimization of an error function that uses the weights $\alpha^{-i}\gamma_i$. The estimates are made in a recursive manner, with $\hat T$ depending on $\alpha$, $\gamma_0$, $t_0$, and a preceding maximum likelihood estimate $\tilde T$ of the period. The value of $\hat t_\phi$ depends on $\alpha$, $\gamma_0$, and $t_0$.

The estimates $\hat T$ and $\hat t_\phi$ also depend on sums $$S_{N-1}^{(n)} = \sum_{i=-(N-2)}^{0} t_i^n \alpha^{-i} \tilde\gamma_i$$

for $n=0$, $1$, and $2$. Specifically, $$\hat T = \tilde T + \frac{(S_{N-1}^{(0)} - S_{N-1}^{(1)})\gamma_0}{a(S_{N-1}^{(0)}S_{N-1}^{(2)} - (S_{N-1}^{(1)})^2) + (S_{N-1}^{(2)} - 2S_{N-1}^{(1)} + S_{N-1}^{(0)})\gamma_0} t_0 \text{ and}$$

$$\hat t_\phi = \frac{-(S_{N-1}^{(2)} - 2S_{N-1}^{(1)} + S_{N-1}^{(0)})\gamma_0}{a(S_{N-1}^{(0)}S_{N-1}^{(2)} - (S_{N-1}^{(1)})^2) + (S_{N-1}^{(2)} - 2S_{N-1}^{(1)} + S_{N-1}^{(0)})\gamma_0} t_0.$$

Once $\hat T$ and $\hat t_\phi$ are obtained, the sums are updated in preparation for a subsequent estimate of the period and time delay.

The present method is preferably implemented by an integrated circuit that produces an output signal whose period and time delay are equal to $\hat{T}$ and $\hat{t}_\phi$, respectively. The physical implementation of the present method therefore results in a digital phase locked loop.

In some embodiments, the forgetting factor $\alpha=1$. In some embodiments, the weighting factors $\gamma_i=1$. In the preferred embodiment, $\alpha<1$, and each of the weighting factors $\gamma_i$ is given a value indicating a confidence level in the accuracy of transition time $t_i$. The weighting factors are particularly useful when receiving a signal with absent transitions. A weighting factor of zero is assigned to missed transitions; therefore good estimates of the period and time delay are maintained. Thus the digital phase locked loop of the present invention can lock onto some aperiodic signals.

The forgetting factor $\alpha$ is adjusted to give a desired insensitivity to noise. As $\alpha$ approaches 1, the estimates $\hat{T}$ and $\hat{t}_\phi$ of the period and time delay become increasingly unresponsive to noise as well as to long-term changes in the period and time delay of the input signal. The forgetting factor $\alpha$ is selected so that, after a predetermined number of transition times, the estimates $\hat{T}$ and $\hat{t}_\phi$ have a desired variance. The digital phase locked loop can therefore be used even when the input signal is very noisy.

DETAILED DESCRIPTION

I. Method

A digital phase locked loop receives an input signal $s(t)$. The input signal is the sum of a source signal $s_{ideal}$ and a noise term $n(t)$ which corrupts the source signal. The source signal is a function of a source frequency $\omega_s$ and a source phase $\phi_s$. Therefore the input signal $s(t)$ can be expressed as:

$$s(t)=s_{ideal}(\omega_s,\phi_s,t)+n(t).$$

The noise term $n(t)$ is assumed to be a single humped distribution with a maximum at zero. Standard random variable analysis can therefore be applied to develop maximum likelihood estimations $\hat{\omega}$ and $\hat{\phi}$ of the angular frequency and phase, respectively, of input signal $s(t)$.

N samples of the input signal are taken at times $t_i$, resulting in N values $s_i$. The samples are indexed such that $-(N-1) \leq i \leq 0$. The sample $s_0$ at time $t_0$ is the most recent. From these samples an error function $err_1$ is constructed that depends on an assumed frequency and phase, $\omega$ and $\phi$, of the input signal:

$$err_1(\omega,\phi) = \sum_{i=-(N-1)}^{0} (s_i - s_{ideal}(\omega,\phi,t))^2 \quad (1)$$

Because noise term $n(t)$ is single humped, the values of $\omega$ and $\phi$ that minimize error function $err_1(\omega,\phi)$ are the desired maximum likelihood values $\hat{\omega}$ and $\hat{\phi}$. When the source frequency and phase do not vary with time, minimizing error function $err_1$ is the ideal way to find $\hat{\omega}$ and $\hat{\phi}$, given the assumption about the noise.

When $\omega_s$ and $\phi_s$ vary slowly with time, Eq.(1) should be modified to include a coefficient in the error function that is a function of time or of sample number so that old samples contribute less to the error function than newer samples. For example, a forgetting factor $\alpha$, where $0<\alpha<1$, can be used to construct a new error function $err_2$:

$$err_2(\omega,\phi) = \sum_{i=-(N-1)}^{0} a^{-i}(s_i - s_{ideal}(\omega,\phi,t))^2 \quad (2)$$

When the newer samples close to index zero were generated by a new frequency and phase, and the older samples were generated by a different frequency and phase, the estimates generated from Eq.(2) are closer to the new frequency and phase.

The present method uses a digital attribute of input signal $s(t)$. The source signal $s_{ideal}$ is characterized by a set of periodic times, called transition times $t_i$. Given a digital source, the transition times could be the low to high transitions that occur every period. Given a periodic analog signal, the transition times could be the times of upward zero crossings. In any case, the transition times are ideally regular:

$$t_i^{ideal} = iT^{ideal} + t_\phi^{ideal}.$$

Here $T^{ideal}$ is the period of the source, $T^{ideal}=2\pi/\omega_s$, and $t_\phi^{ideal}$ is a time delay corresponding to the phase of the source, $t_\phi^{ideal}=T^{ideal}(\phi_s/2\pi)$. Although $t_\phi^{ideal}$ is a time and not an angle, $t_\phi^{ideal}$ is sometimes referred to as a phase, since $t_\phi^{ideal}$ is proportional to the phase of the source signal.

The signal detected is not ideal, but is corrupted by noise that shifts the transition times forward and backward:

$$t_i = iT^{ideal} + t_\phi^{ideal} + n_i.$$

The phase locked loop according to the present invention determines maximum likelihood estimates $\hat{T}$ and $\hat{t}_\phi$ of the period $T^{ideal}$ and time delay $t_\phi^{ideal}$ of the source. The estimates $\hat{T}$ and $\hat{t}_\phi$ are found by constructing an error function $err_3$ using N transition times $t_i$ and assumed values T and $t_\phi$ of the period and time delay of the input signal:

$$err_3(T, t_\phi) = \sum_{i=-(N-1)}^{0} a^{-i}\gamma_i(t_i - (iT + t_\phi))^2 \quad (3)$$

The function $err_3$ gives a weight $\alpha^{-i}\gamma_i$ to the $i^{th}$ transition time. As before, the term $\alpha^{-i}$ is a power of the forgetting factor $\alpha$ that reduces the importance of samples that occurred in the distant past.

The weight of the $i^{th}$ sample also contains a weighting factor $\gamma_i$ which can vary from sample to sample. Weighting factor $\gamma_i$ is a relative importance of a particular sample. The weighting factors are particularly useful when receiving a signal with absent transitions. For example, the phase locked loop may be reconstructing a carrier wave, from a data signal which has transitions that occur irregularly, but always occur within regularly spaced windows. If the $i^{th}$ transition does not take place within a particular window, a weighting factor $\gamma_i=0$ is assigned to transition time $t_i$. The zero weighting factor prevents a missed transition from spoiling the error function, allowing good estimates of $\hat{T}$ and $\hat{t}_\phi$ to be maintained.

The values of T and $t_\phi$ that minimize $err_3$ are the desired maximum likelihood estimates $\hat{T}$ and $\hat{t}_\phi$. At the minimum of $err_3$, $$\frac{\partial}{\partial t_\phi}err_3(T,t_\phi)\bigg|_{\hat{T},\hat{t}_\phi}=0 \quad \text{and} \quad \frac{\partial}{\partial T}err_3(T,t_\phi)\bigg|_{\hat{T},\hat{t}_\phi}=0.$$

Evaluating these expressions gives $$\sum_{i=-(N-1)}^{0} a^{-i}\gamma_i(t_i-(i\hat{T}+\hat{t}_\phi))=0 \quad \text{and} \tag{4}$$

$$\sum_{i=-(N-1)}^{0} a^{-i}\gamma_i(t_i-(i\hat{T}+\hat{t}_\phi))i=0.$$

Five sums are defined as follows:

$$S_N^{(0)} = \sum_{i=-(N-1)}^{0} a^{-i}\gamma_i, \tag{5}$$

$$S_N^{(1)} = \sum_{i=-(N-1)}^{0} ia^{-i}\gamma_i, \tag{6}$$

$$S_N^{(2)} = \sum_{i=-(N-1)}^{0} i^2 a^{-i}\gamma_i, \tag{7}$$

$$S_{Nt}^{(0)} = \sum_{i=-(N-1)}^{0} a^{-i}\gamma_i t_i, \tag{8}$$

$$S_{Nt}^{(1)} = \sum_{i=-(N-1)}^{0} ia^{-i}\gamma_i t_i. \tag{9}$$

Eqs. (4) can be solved in terms of these sums:

$$\hat{T} = \frac{S_N^{(1)}S_{Nt}^{(0)} - S_N^{(0)}S_{Nt}^{(1)}}{(S_N^{(1)})^2 - S_N^{(0)}S_N^{(2)}} \quad \text{and} \quad \hat{t}_\phi = \frac{S_N^{(2)}S_{Nt}^{(0)} - S_N^{(1)}S_{Nt}^{(1)}}{(S_N^{(1)})^2 - S_N^{(0)}S_N^{(2)}}. \tag{10}$$

While it is possible to use Eqs. (10) to determine $\hat{T}$ and $\hat{t}_\phi$, the phase locked loop of the present invention uses previous estimates of the period and time delay, as well as previous values of the sums of Eqs. (5)–(9).

Before the arrival of the $N^{th}$ transition time $t_0$, $N-1$ transition times $\tilde{t}_i$ were received, for $i=-(N-2)$ to 0. Each transition time $\tilde{t}_i$ had weight $\alpha^{-i}\tilde{\gamma}_i$, and $(N-1)^{th}$ estimates $\tilde{T}$ and $\tilde{t}_\phi$ of the period and the time delay of the input signal were calculated using previous values of the sums of Eqs. (5)–(9). Specifically, $$S_{N-1}^{(n)} = \sum_{i=-(N-2)}^{0} i^n a^{-i}\tilde{\gamma}_i$$

for n=0, 1, and 2; and $$S_{(N-1)t}^{(n)} = \sum_{i=-(N-2)}^{0} i^n a^{-i}\tilde{\gamma}_i \tilde{t}_i$$

for n=0 and 1. Then the old estimates $\tilde{T}$ and $\tilde{t}_\phi$ are given by the analogue of Eqs.(10):

$$\tilde{T} = \frac{S_{N-1}^{(1)}S_{(N-1)t}^{(0)} - S_{N-1}^{(0)}S_{(N-1)t}^{(1)}}{(S_{N-1}^{(1)})^2 - S_{N-1}^{(0)}S_{N-1}^{(2)}} \quad \text{and} \tag{11}$$

$$\tilde{t}_\phi = \frac{S_{N-1}^{(2)}S_{(N-1)t}^{(0)} - S_{N-1}^{(1)}S_{(N-1)t}^{(1)}}{(S_{N-1}^{(1)})^2 - S_{N-1}^{(0)}S_{N-1}^{(2)}}.$$

Eqs. (10) can be reworked so that $\hat{T}$ and $\hat{t}_\phi$ can be calculated in an incremental fashion as new transition times are received, to avoid having to re-evaluate all sums in their entirety just to incorporate the effect of one new transition time. The most recent transition time is $t_0$, and transition time $t_{i-1}$ is older than transition time $t_i$. To incorporate a new transition time, the transition times that were indexed $i=-(N-2)$ through $i=0$ are shifted to indices $i=-(N-1)$ through $i=-1$ to make room for the new transition time $t_0$.

The transformation between old transition times $\tilde{t}_i$ and new transition times $t_i$ is:

$$t_{i-1}=\tilde{t}_i-\tilde{T}-\tilde{t}_\phi \tag{12}$$

This transformation causes the expectation value, or average value, of $t_0$ to be zero:

$$<t_0>=0.$$

The arbitrary weighting factors $\gamma_i$ remain associated with the transition time to which they were first assigned. Therefore the relationship between the old weighting factors $\tilde{\gamma}_i$ and the new weighting factors $\gamma_i$ is:

$$\gamma_{i-1}=\tilde{\gamma}_i. \tag{13}$$

Eq. (5) can be transformed into a recursive relationship by breaking out the first element of the sum, reindexing the remaining sum, then using Eq. (13):

$$S_N^{(0)} = \gamma_0 + \sum_{i=-(N-1)}^{-1} a^{-i}\gamma_i = \gamma_0 + \sum_{i=-(N-2)}^{0} a^{-(i-1)}\gamma_{i-1} = \gamma_0 + a\sum_{i=-(N-2)}^{0} a^{-i}\tilde{\gamma}_i.$$

Therefore, $$S_N^{(0)}=\gamma_0+\alpha S_{N-1}^{(0)}. \tag{14}$$

Similar mathematical manipulations give recursive equations for sums $S_N^{(1)}$ and $S_N^{(2)}$:

$$S_N^{(1)}=\alpha(S_{N-1}^{(1)}-S_{N-1}^{(0)}), \tag{15}$$

$$S_N^{(2)}=\alpha(S_{N-1}^{(2)}-2S_{N-1}^{(1)}-S_{N-1}^{(0)}). \tag{16}$$

Recursive relations for $S_{Nt}^{(n)}$ can also be derived using Eqs. (12) and (13):

$$S_{Nt}^{(0)}=\gamma_0 t_0+\alpha S_{(N-1)t}^{(0)}-\alpha S_{N-1}^{(0)}(\tilde{T}+\tilde{t}_\phi), \tag{17}$$

$$S_{N_t}^{(1)} = \alpha S_{(N-1)_t}^{(1)} - \alpha S_{(N-1)_t}^{(0)} - \alpha S_{N-1}^{(1)}(\hat{T}+\hat{t}_\phi) + \alpha S_{N-1}^{(0)}(\hat{T}+\hat{t}_\phi) \quad (18)$$

Now, using Eqs. (11) and (14–18), Eqs. (10) can be transformed to the following expressions:

$$\hat{T} = \tilde{T} + \frac{(S_{N-1}^{(0)} - S_{N-1}^{(1)})\gamma_0}{a(S_{N-1}^{(0)}S_{N-1}^{(2)} - (S_{N-1}^{(1)})^2) + (S_{N-1}^{(2)} - 2S_{N-1}^{(1)} + S_{N-1}^{(0)})\gamma_0} t_0 \quad (19)$$

$$\hat{t}_\phi = \frac{-(S_{N-1}^{(2)} - 2S_{N-1}^{(1)} + S_{N-1}^{(0)})\gamma_0}{a(S_{N-1}^{(0)}S_{N-1}^{(2)} - (S_{N-1}^{(1)})^2) + (S_{N-1}^{(2)} - 2S_{N-1}^{(1)} + S_{N-1}^{(0)})\gamma_0} t_0 \quad (20)$$

Notice that the sums $S_{(N-1)_t}^{(n)}$ do not appear in Eqs. (19) and (20).

Equations (14)–(16) and (19)–(20) are the cornerstones of the present method of implementing a phase locked loop. A computing device maintains the internal variables $S_{N-1}^{(0)}$, $S_{N-1}^{(1)}$, $S_{N-1}^{(2)}$, $\tilde{T}$ and $\tilde{t}_\phi$. The debice then identifies transition time $t_0$ of the input signal, and determines the value of weighting factor $\gamma_0$. The device calculates new maximum likelihood estimates $\hat{T}$ and $\hat{t}_\phi$ using Eqs. (19) and (20), then updates the sums according to Eqs. (14)–(16). Preferably, the device creates an output signal based on the estimates $\hat{T}$ and $\hat{t}_\phi$. The process is repeated for each transition time received.

As will be clear to one skilled in the art, the device will operate faster if parts of Eqs. (19) and (20) are calculated in advance, before the arrival of transition time $t_0$. For example, in some embodiments, the coefficient of $t_0$ appearing in Eq. (20) is calculated in advance, assuming $\gamma_0=1$. When transition time to arrives, weighting factor $\gamma_0$ is determined. If $\gamma_0=1$, the pre-calculated coefficient is multiplied by transition time $t_0$ to obtain $\hat{t}_\phi$. If $\gamma_0=0$, $\hat{t}_\phi=0$.

In general, the weighting factors $\gamma_i$ are not determined ahead of time. However, some simplification of the method occurs if all the weighting factors are identically equal to, one: $\gamma_i=1$. The sums $S_{N-1}^{(n)}$ can then be evaluated analytically, with the following results:

$$\hat{T} = \tilde{T} + \left[\frac{(N-1)a^{N+2} - (3N-2)a^{N+1} + (3N-1)a^N + a^2 - 2a + 1}{a^{2N} - N^2 a^{N+1} + 2(N^2-1)a^N - N^2 a^{N-1} + 1}\right]t_0, \quad (21)$$

$$\hat{t}_\phi = \left[\frac{-(N-1)^2 a^{N+2} + (3N-4)Na^{N+1} - (3N+1)(N-1)a^N + N^2 a^{N-1} + a^2 - 1}{a^{2N} - N^2 a^{N+1} + 2(N^2-1)a^N - N^2 a^{N-1} + 1}\right]t_0. \quad (22)$$

Still further simplification occurs in at least two different limits. In the first limit, the number of samples N is taken to be very large: N→∞. In this case, Eqs. (21) and (22) reduce to:

$$\hat{T} = \tilde{T} + (1-\alpha)^2 t_0, \quad (23)$$

$$\hat{t}_\phi = -(1-\alpha^2) t_0. \quad (24)$$

In the second limit, N is finite, and the forgetting factor α approaches unity: α→1. In this limit, Eqs. (21) and (22) become:

$$\hat{T} = \tilde{T} + \frac{6}{N(N+1)} t_0, \quad (25)$$

$$\hat{t}_\phi = \frac{-2(2N-1)}{N(N+1)} t_0. \quad (26)$$

II. Apparatus

Figure 1:
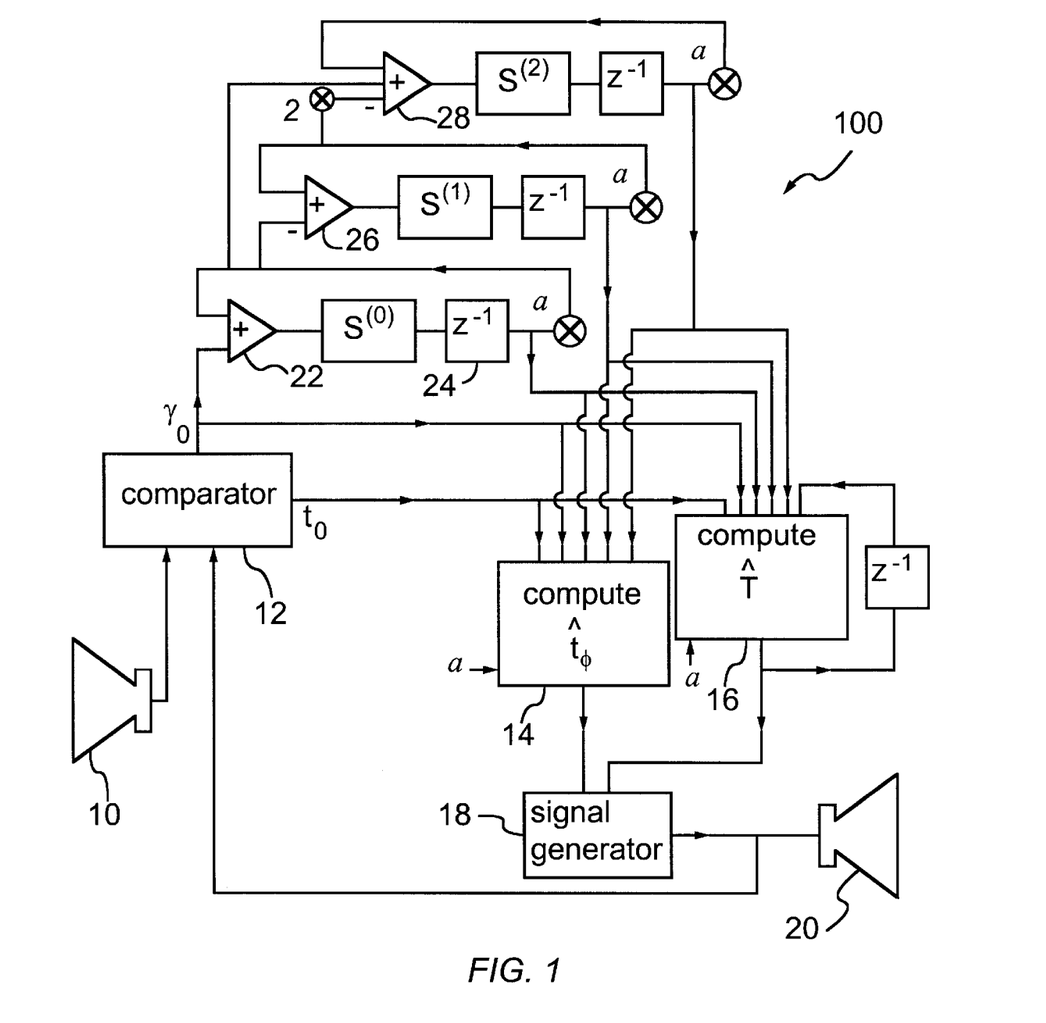
FIG. 1 is a schematic of a digital phase locked loop according to the preferred embodiment of the invention.

FIG. 1 is a diagram of a circuit 100 of a digital phase locked loop according to the preferred embodiment of the invention. A receiver 10 receives the input signal and sends the input signal to a comparator 12. The comparator identifies transition time $t_0$ and delivers an electrical signal corresponding to transition time $t_0$ to circuit elements 14 and 16.

Preferably, comparator 12 compares transition time $t_0$ to an expected time t', and determines the value of weighting factor $\gamma_0$ based upon the proximity of $t_0$ to t'. For example, in one embodiment, $\gamma_0=1$ if $|t_0-t'|\leq w$ for some preselected value of w, and $\gamma_0=0$ if $|t_0-t'|>w$. Many other methods for choosing the value of $\gamma_0$ will be apparent to one skilled in the art, and could be used by comparator 12. In the preferred embodiment, the times $t_0$ and t' are normalized so that t'=0. In other words, transition time $t_0$ is the time of a transition of the input signal, measured relative to the expected time t' of the transition.

Circuit element 14 computes the maximum likelihood estimate of the time delay, $\hat{t}_\phi$, according to Eq. (20). Circuit element 16 computes the value of $\hat{T}$ according to Eq. (19). The period and time delay estimates $\hat{T}$ and $\hat{t}_\phi$ are output from circuit elements 16 and 14 to a signal generator 18 that generates an output signal having a period and a time delay equal to $\hat{T}$ and $\hat{t}_\phi$, respectively. The output signal is sent to comparator 12, so that the comparator may determine the expected time t'. The output signal is also sent to an electrical output 20 that transmits the output signal to other devices as needed.

Weighting factor $\gamma_0$ is output from comparator 12 to an adder 22 whose result is the value of $S_N^{(0)}$ according to Eq. (14). The value of $S_{N-1}^{(0)}$ is stored in delay element 24, and is sent to circuit elements 14 and 16 to calculate and $\hat{t}_\phi$ and $\hat{T}$. $S_{N-1}^{(0)}$ is also multiplied by forgetting factor α and is input into adder 22 to compute $S_N^{(0)}$. The value of $S_N^{(0)}$ that is output from adder 22 is subsequently stored in delay element 24 in preparation for the arrival of the next transition time. Similarly, adders 26 and 28 output $S_N^{(1)}$ and $S_N^{(2)}$, respectively.

Figure 2:
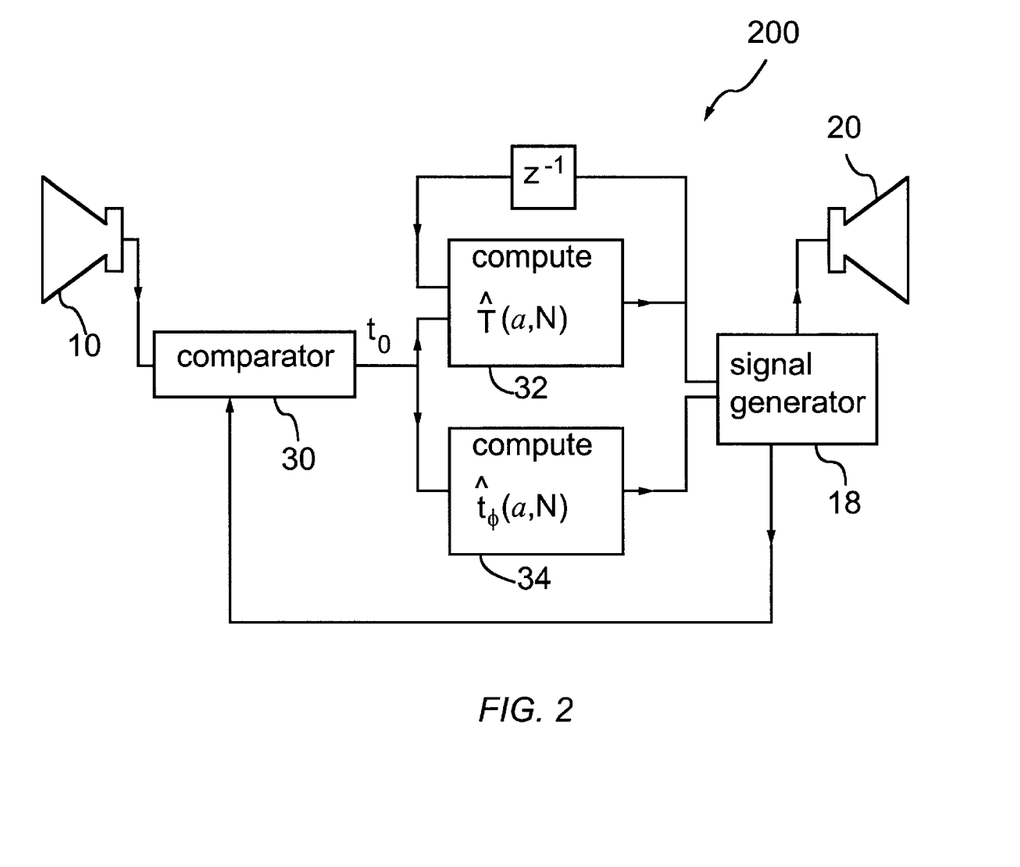
FIG. 2 is a schematic of a digital phase locked loop according to a second embodiment of the invention.

FIG. 2 is a diagram of a circuit 200 of a digital phase locked loop according to a second embodiment of the invention. In this embodiment, all weighting factors $\gamma_i=1$. A comparator 30 determines the transition time $t_0$ of the input signal received by receiver 10. As before, transition time $t_0$ is measured relative to the expected time t' of the transition. Expected time t' is obtained from signal generator 18. Transition time $t_0$ is sent to circuit elements 32 and 34 that compute $\hat{T}$ and $\hat{t}_\phi$ according to Eqs. (21) and (22), respectively. In an alternative embodiment, circuit elements 32 and 34 compute $\hat{T}$ and $\hat{t}_\phi$ according to Eqs. (23) and (24), respectively. In another alternative embodiment, circuit elements 32 and 34 compute $\hat{T}$ and $\hat{t}_\phi$ according to Eqs. (25) and (26), respectively.

III. Synchronization Quality

The quality of the synchronization of the phase locked loop can be determined by considering the noise in $\hat{T}$ and $\hat{t}_\phi$ to be generated by the sequence of independent identically distributed random variables $n_i$. Transition times $t_i$ are given by $$t_i = iT^{ideal} + t_\phi^{ideal} + n_i.$$

If the incoming period $T^{ideal}$ and phase $t_\phi^{ideal}$ are stable, taking on constant values for all time, then the variation in the estimates $\hat{T}$ and $\hat{t}_\phi$ is due to the added noise.

Through Eqs. (10) the variance of $\hat{T}$ and $\hat{t}_\phi$ can be expressed in terms of the mean $<n>$ and variance $<n^2>-<n>^2$ of each of the $n_i$'s. Therefore, given the parameters $\alpha$, N, and the $\gamma_i$'s, the accuracy with which the phase locked loop is estimating and locking onto the input signal can be determined. The user can alter the parameters, making trade-offs between locking accuracy, tracking of source variations, and locking speed.

The noise is assumed to have the following characteristics: $<n_i>=0$ for every i, and $<n_i n_j>=0$ when $i \neq j$. Furthermore, the value of $<n_i^2>$ is the same for every i: $<n_i^2>\equiv<n^2>$. From these assumptions, the variance of $\hat{T}$ and $\hat{t}_\phi$ can be derived from Eqs. (10):

$$\langle \hat{T}^2 \rangle - \langle \hat{T} \rangle^2 = \frac{1}{\left((S_N^{(1)})^2 - S_N^{(0)}S_N^{(2)}\right)^2} \left\{ (S_N^{(1)})^2 \sum_{i=-(N-1)}^{0} a^{-2i}\gamma_i^2 - 2S_N^{(0)}S_N^{(1)} \sum_{i=-(N-1)}^{0} ia^{-2i}\gamma_i^2 + (S_N^{(0)})^2 \sum_{i=-(N-1)}^{0} i^2 a^{-2i}\gamma_i^2 \right\} \langle n^2 \rangle \quad (27)$$

$$\langle \hat{t}_\phi^2 \rangle - \langle \hat{t}_\phi \rangle^2 = \frac{1}{\left((S_N^{(1)})^2 - S_N^{(0)}S_N^{(2)}\right)^2} \left\{ (S_N^{(2)})^2 \sum_{i=-(N-1)}^{0} a^{-2i}\gamma_i^2 - 2S_N^{(1)}S_N^{(2)} \sum_{i=-(N-1)}^{0} ia^{-2i}\gamma_i^2 + (S_N^{(1)})^2 \sum_{i=-(N-1)}^{0} i^2 a^{-2i}\gamma_i^2 \right\} \langle n^2 \rangle \quad (28)$$

Eqs. (27) and (28) give the variance of the maximum likelihood estimates of the period and time delay for any N, $\alpha$, and an arbitrary set of weighting factors $\gamma_i$.

A better understanding of the variances of $\hat{T}$ and $\hat{t}_\phi$ can be obtained by considering the case when $\gamma_i=1$ for all i. Two limits of this case are especially informative. In the first limit, the forgetting factor $\alpha \to 1$. In this limit, $$\langle \hat{T}^2 \rangle - \langle \hat{T} \rangle^2 = \frac{12}{N(N^2-1)} \langle n^2 \rangle, \quad (29)$$

$$\langle \hat{t}_\phi^2 \rangle - \langle \hat{t}_\phi \rangle^2 = \frac{2(2N-1)}{N(N+1)} \langle n^2 \rangle. \quad (30)$$

Figure 3:
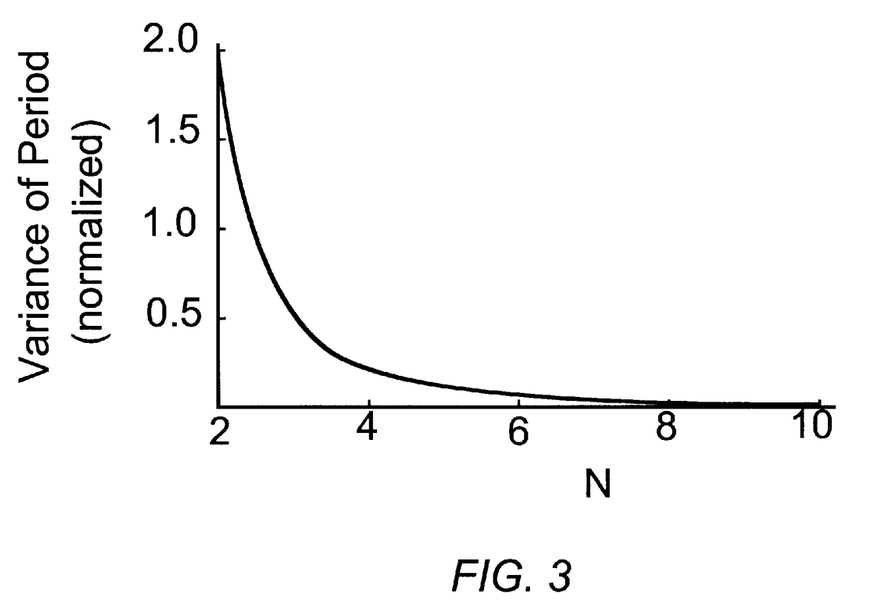
FIG. 3 is a graph of the variance of an estimated period versus a sample number N.
Figure 4:
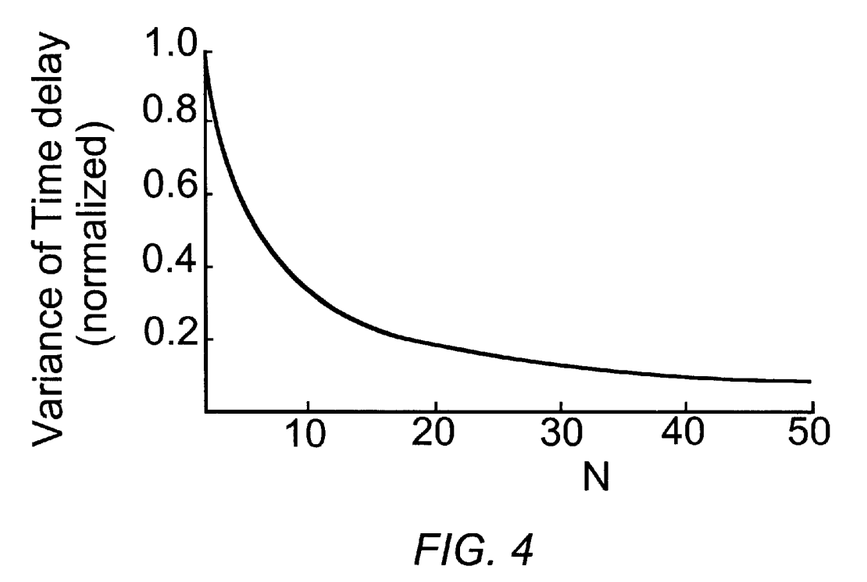
FIG. 4 is a graph of the variance of an estimated time delay versus sample number N.

FIG. 3 shows a graph of the variance of the estimated period, normalized by the variance of the noise, versus N. That is, FIG. 3 is a graph of $(<\hat{T}^2>-<\hat{T}>^2)/<n^2>$ versus N, as given by Eq. (29). FIG. 4 is a graph of the normalized variance of the time delay vs. N, as given by Eq. (30).

In the second limit, $N \to \infty$ and $\alpha$ remains arbitrary. In this limit, $$\langle \hat{T}^2 \rangle - \langle \hat{T} \rangle^2 = \frac{2(1-a^3)}{(1+a)^3} \langle n^2 \rangle, \quad (31)$$

$$\langle \hat{t}_\phi^2 \rangle - \langle \hat{t}_\phi \rangle^2 = \frac{1 + 3a + a^2 - 5a^3}{(1+a)^3} \langle n^2 \rangle. \quad (32)$$

Figure 5:
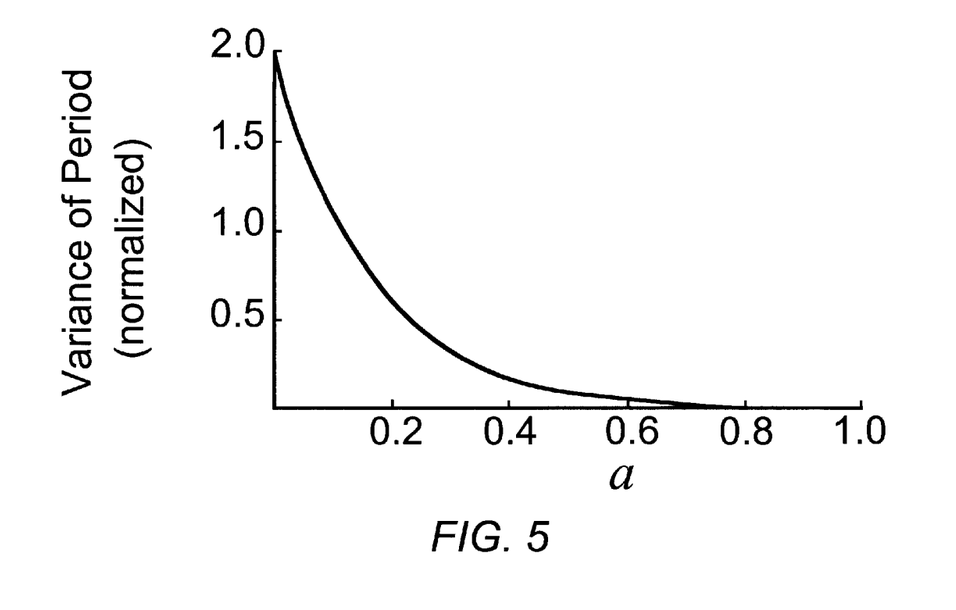
FIG. 5 is a graph of the variance of the estimated period versus a forgetting factor $\alpha$.
Figure 6:
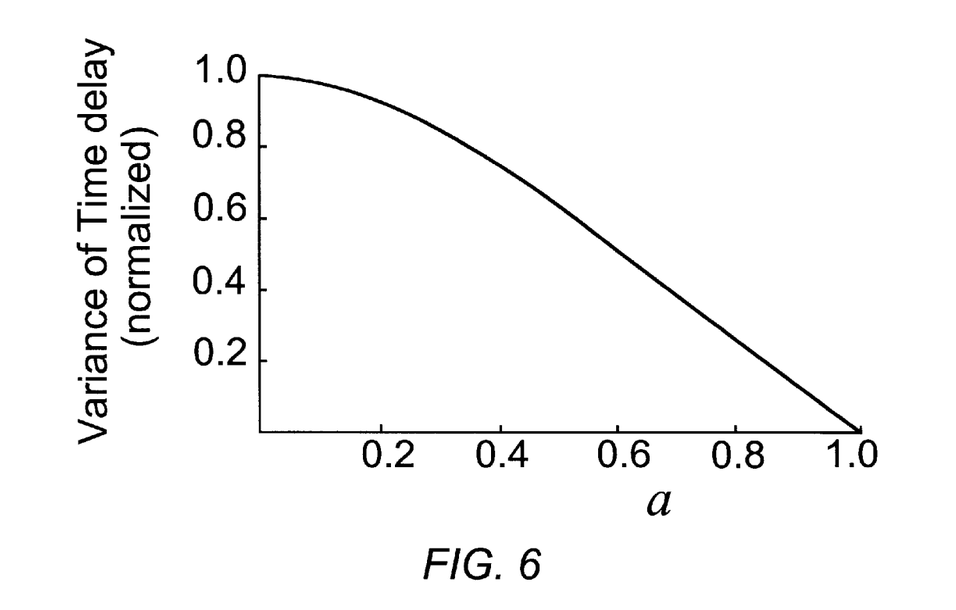
FIG. 6 is a graph of the variance of the estimated time delay versus forgetting factor $\alpha$.

FIG. 5 is a graph of the variance of $\hat{T}$ vs. $\alpha$ according to Eq. (31). FIG. 6 is a plot of the variance of $\hat{t}_\phi$ vs. $\alpha$ according to Eq. (32). In FIGS. 5 and 6, as in FIGS. 3 and 4, the variances are normalized by the variance of the noise, $<n^2>$.

As FIGS. 3–6 show, the variance of both the period and the time delay decrease as N increases and as $\alpha$ increases. The variances of the period and the time delay approach zero as $\alpha \to 1$ and $N \to \infty$. This indicates that given an infinite number of transition times all evenly weighted, the phase locked loop would produce a perfect estimate of the period and the time delay of the input signal.

In more realistic situations, Eqs. (27) and (28) must be used to determine the values of $\alpha$ and N that give characteristics that will satisfy the needs of the desired application of the phase locked loop. A larger value of $\alpha$ may be traded off for a larger value of N for a given variance of the period or time delay. A larger value of $\alpha$ slows the response to a variation in either the period $T^{ideal}$ or phase $t_\phi^{ideal}$ of the source. A larger value of N means a larger number of samples are needed to reach a locked state.

Figure 7:
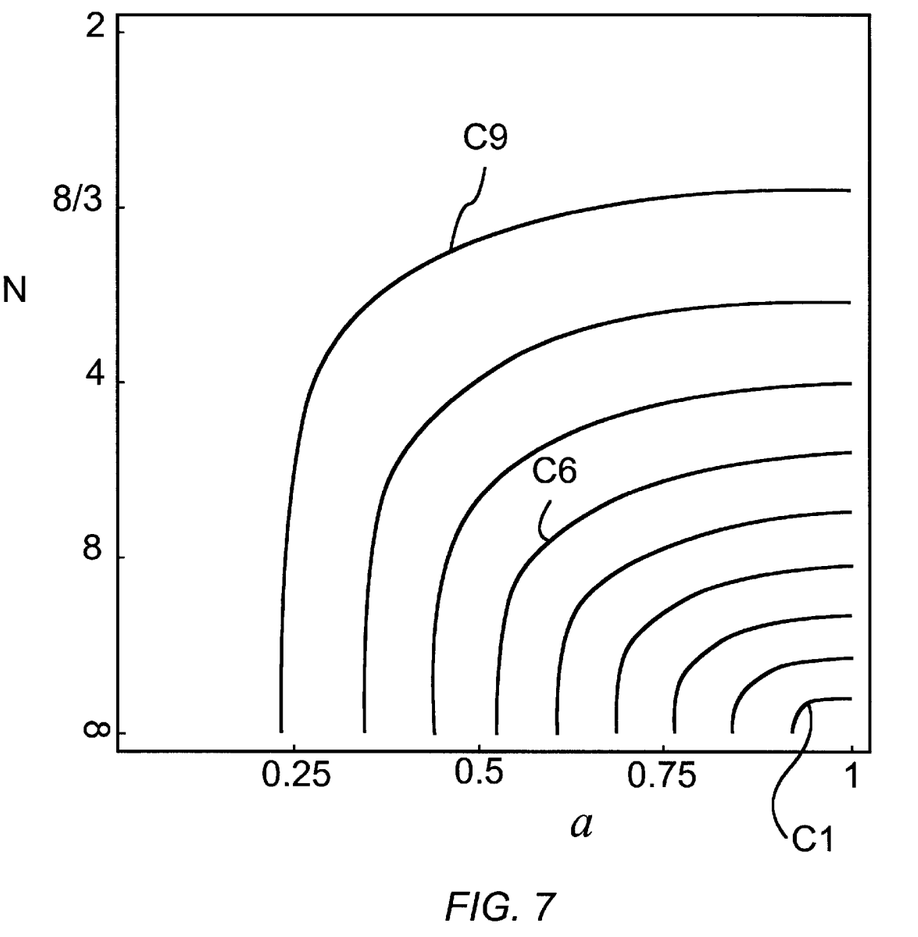
FIG. 7 is a contour plot of the variance of the estimated time delay versus N and $\alpha$.

FIG. 7 is a contour plot of the normalized variance of $\hat{t}_\phi$ vs. $\alpha$ and N. Along a contour C9, the normalized variance of $\hat{t}_\phi$ is equal to 0.9. Along a contour C1, the normalized variance is 0.1. Intermediate contours are shown in increments of 0.1. For example, along a contour C6, $(<\hat{t}_\phi^2>-<\hat{t}_\phi>^2)/<n^2>=0.6$. FIG. 7 can be used to determine the optimum value of $\alpha$ needed for a given application. In FIGS. 3–7, it is assumed that all of the weighting factors are equal to one.

It will be apparent to one skilled in the art that many variations of the above method and apparatus are possible. Therefore, the scope of the invention should be determined by the following claims and their legal equivalents.

I claim:

1. A method of estimating a period and a time delay of a signal, said method comprising the steps of:

a) selecting a forgetting factor $\alpha$;

b) electrically receiving an $N^{th}$ transition time $t_0$ of said signal;

c) assigning an $N^{th}$ weighting factor $\gamma_0$ to said $N^{th}$ transition time $t_0$;

d) electronically computing a maximum likelihood estimate $\hat{T}$ of said period using said $N^{th}$ transition time $t_0$, said forgetting factor $\alpha$, said $N^{th}$ weighting factor $\gamma_0$, and a preceding maximum likelihood estimate $\tilde{T}$ of said period; and e) electronically computing a maximum likelihood estimate $\hat{t}_\phi$ of said time delay using said $N^{th}$ transition time $t_0$, said forgetting factor $\alpha$, and said $N^{th}$ weighting factor $\gamma_0$.

2. The method of claim 1, further comprising the steps of:

a) receiving N−1 transition times $\tilde{t}_i$ prior to said $N^{th}$ transition time $t_0$;

b) assigning a weighting factor $\gamma_i$ to each of said N−1 transition times $\tilde{t}_i$;

c) electronically storing sums $S_{N-1}^{(n)}$ for n=0, 1, and 2, wherein $$S_{N-1}^{(n)} = \sum_{i=-(N-2)}^{0} i^n a^{-i} \tilde{\gamma}_i.$$

3. The method of claim 2, wherein $$\hat{T} = \tilde{T} + \frac{(S_{N-1}^{(0)} - S_{N-1}^{(1)})\gamma_0}{a\left(S_{N-1}^{(0)}S_{N-1}^{(2)} - (S_{N-1}^{(1)})^2\right) + (S_{N-1}^{(2)} - 2S_{N-1}^{(1)} + S_{N-1}^{(0)})\gamma_0} t_0 \text{ and}$$

$$\hat{t}_\phi = \frac{-(S_{N-1}^{(2)} - 2S_{N-1}^{(1)} + S_{N-1}^{(0)})\gamma_0}{a\left(S_{N-1}^{(0)}S_{N-1}^{(2)} - (S_{N-1}^{(1)})^2\right) + (S_{N-1}^{(2)} - 2S_{N-1}^{(1)} + S_{N-1}^{(0)})\gamma_0} t_0.$$

4. The method of claim 2, further comprising the step of electronically computing sums $S_N^{(n)}$ for n=0, 1, and 2 using the following formulas:

$$S_N^{(0)} = \gamma_0 + \alpha S_{N-1}^{(0)},$$

$$S_N^{(1)} = \alpha(S_{N-1}^{(1)} - S_{N-1}^{(0)}),$$

and $$S_N^{(2)} = \alpha(S_{N-1}^{(2)} - 2S_{N-1}^{(1)} + S_{N-1}^{(0)}).$$

5. A method of estimating a period and a time delay of a signal, said method comprising the steps of:
   a) electrically receiving an $N^{th}$ transition time $t_0$ of said signal,
   b) electronically computing a maximum likelihood estimate $\hat{T}$ of said period using said $N^{th}$ transition time $t_0$ and a preceding maximum likelihood estimate $\tilde{T}$ of said period, and
   c) electronically computing an $N^{th}$ maximum likelihood estimate $\hat{t}_\phi$ of said time delay using said $N^{th}$ transition time $t_0$.

6. The method of claim 5, wherein $$\hat{T} = \tilde{T} + \frac{6}{N(N+1)} t_0 \quad \text{and} \quad \hat{t}_\phi = \frac{-2(2N-1)}{N(N+1)} t_0.$$

7. The method of claim 5, further comprising the step of selecting a forgetting factor $\alpha$, and wherein said estimates $\hat{T}$ and $\hat{t}_\phi$ depend upon said forgetting factor $\alpha$.

8. The method of claim 7, wherein $$\hat{T} = \tilde{T} + \left[ \frac{(N-1)a^{N+2} - (3N-2)a^{N+1} + (3N-1)a^N + a^2 - 2a + 1}{a^{2N} - N^2 a^{N+1} + 2(N^2-1)a^N - N^2 a^{N-1} + 1} \right] t_0 \quad \text{and}$$

$$\hat{t}_\phi = \left[ \frac{-(N-1)^2 a^{N+2} + (3N-4)Na^{N+1} - (3N+1)(N-1)a^N + N^2 a^{N-1} + a^2 - 1}{a^{2N} - N^2 a^{N+1} + 2(N^2-1)a^N - N^2 a^{N-1} + 1} \right] t_0.$$

9. The method of claim 7, wherein $$\hat{T} = \tilde{T} + (1-\alpha)^2 t_0 \quad \text{and} \quad \hat{t}_\phi = -(1-\alpha^2) t_0.$$

10. The method of claim 7, further comprising the step of receiving an $N^{th}$ weighting factor $\gamma_0$, and wherein said estimates $\hat{T}$ and $\hat{t}_\phi$ depend upon said $N^{th}$ weighting factor $\gamma_0$.

11. A digital phase locked loop for locking on to an input signal, said phase locked loop comprising:
   a) a receiving means for receiving said input signal;
   b) a means for determining (i) an $N^{th}$ transition time $t_0$ of said input signal, and (ii) an $N^{th}$ weighting factor $\gamma_0$ to said transition time $t_0$;
   c) a circuit for computing maximum likelihood estimates $\hat{T}$ and $\hat{t}_\phi$ of a period and a time delay, respectively, of said input signal, wherein said circuit computes said estimate $\hat{T}$ using a forgetting factor $\alpha$, said $N^{th}$ weighting factor $\gamma_0$, said $N^{th}$ transition time $t_0$, and a preceding maximum likelihood estimate $\tilde{T}$ of said period; and wherein said circuit computes said estimate $\hat{t}_\phi$ using said forgetting factor $\alpha$, said $N^{th}$ weighting factor $\gamma_0$, and said $N^{th}$ transition time $t_0$; and
   d) an electrical output responsive to said circuit, for sending an output signal characterized by said estimates $\hat{T}$ and $\hat{t}_\phi$.

12. The digital phase locked loop of claim 11, wherein said circuit records values of sums $S_{N-1}^{(n)}$ for $n=0, 1,$ and 2, wherein $$S_{N-1}^{(n)} = \sum_{i=(N-2)}^{0} i^n a^{-i} \tilde{\gamma}_i,$$

$\gamma_i$ being a weighting factor of an $i^{th}$ transition time prior to said $N^{th}$ transition time $t_0$.

13. The digital phase locked loop of claim 12, wherein said circuit computes said estimates $\hat{T}$ and $\hat{t}_\phi$ according to the following formulas:

$$\hat{T} = \tilde{T} + \frac{(S_{N-1}^{(0)} - S_{N-1}^{(1)})\gamma_0}{a(S_{N-1}^{(0)} S_{N-1}^{(2)} - (S_{N-1}^{(1)})^2) + (S_{N-1}^{(2)} - 2S_{N-1}^{(1)} + S_{N-1}^{(0)})\gamma_0} t_0 \quad \text{and}$$

$$\hat{t}_\phi = \frac{-(S_{N-1}^{(2)} - 2S_{N-1}^{(1)} + S_{N-1}^{(0)})\gamma_0}{a(S_{N-1}^{(0)} S_{N-1}^{(2)} - (S_{N-1}^{(1)})^2) + (S_{N-1}^{(2)} - 2S_{N-1}^{(1)} + S_{N-1}^{(0)})\gamma_0} t_0.$$

14. The digital phase locked loop of claim 12, wherein said circuit computes sums $S_N^{(n)}$ for $n=0, 1,$ and 2 according to the following formulas:

$$S_N^{(0)} = \gamma_0 + \alpha S_{N-1}^{(0)},$$

$$S_N^{(1)} = \alpha(S_{N-1}^{(1)} - S_{N-1}^{(0)}),$$

and $$S_N^{(2)} = \alpha(S_{N-1}^{(2)} - 2S_{N-1}^{(1)} + S_{N-1}^{(0)}).$$

15. A digital phase locked loop for locking on to an input signal, said phase locked loop comprising:
   a) a receiving means for receiving said input signal;
   b) a means for determining an $N^{th}$ transition time $t_0$ of said input signal;
   c) a circuit for computing maximum likelihood estimates $\hat{T}$ and $\hat{t}_\phi$ of a period and a time delay, respectively, of said input signal, wherein said circuit computes said estimate $\hat{T}$ using said $N^{th}$ transition time $t_0$ and a preceding maximum likelihood estimate $\tilde{T}$ of said period; and wherein said circuit computes said estimate $\hat{t}_\phi$ using said $N^{th}$ transition time $t_0$; and
   d) an electrical output responsive to said circuit, for sending an output signal characterized by said estimates $\hat{T}$ and $\hat{t}_\phi$.

16. The digital phase locked loop of claim 15, wherein $$\hat{T} = \tilde{T} + \frac{6}{N(N+1)} t_0 \quad \text{and} \quad \hat{t}_\phi = \frac{-2(2N-1)}{N(N+1)} t_0.$$

17. The digital phase locked loop of claim 15, wherein said circuit computes said estimates $\hat{T}$ and $\hat{t}_\phi$ using a forgetting factor $\alpha$.

18. The digital phase locked loop of claim 17, wherein $$\hat{T} = \tilde{T} + \left[ \frac{(N-1)a^{N+2} - (3N-2)a^{N+1} + (3N-1)a^N + a^2 - 2a + 1}{a^{2N} - N^2 a^{N+1} + 2(N^2-1)a^N - N^2 a^{N-1} + 1} \right] t_0 \quad \text{and}$$

$$\hat{t}_\phi = \left[ \frac{-(N-1)^2 a^{N+2} + (3N-4)Na^{N+1} - (3N+1)(N-1)a^N + N^2 a^{N-1} + a^2 - 1}{a^{2N} - N^2 a^{N+1} + 2(N^2-1)a^N - N^2 a^{N-1} + 1} \right] t_0.$$

19. The digital phase locked loop of claim 17, wherein $\hat{T}=\tilde{T}+(1-\alpha)^2 t_0$ and $\hat{t}_\phi=-(1-\alpha^2)t_0$.

20. The digital phase locked loop of claim 17, further comprising a means for determining an $N^{th}$ weighting factor $\gamma_0$ of said $N^{th}$ transition time $t_0$; wherein said circuit computes said estimates $\hat{T}$ and $\hat{t}_\phi$ using said $N^{th}$ weighting factor $\gamma_0$.

* * * * *